United States Patent
Sugiura

(10) Patent No.: US 10,763,729 B2
(45) Date of Patent: Sep. 1, 2020

(54) ELECTRONIC CONTROL UNIT, AND ELECTRIC POWER STEERING DEVICE USING THE SAME

(71) Applicant: DENSO CORPORATION, Kariya, Aichi-pref. (JP)

(72) Inventor: Hiroyasu Sugiura, Kariya (JP)

(73) Assignee: DENSO CORPORATION, Kariya, Aichi-Pref. (JP)

( * ) Notice: Subject to any disclaimer, the term of this patent is extended or adjusted under 35 U.S.C. 154(b) by 89 days.

(21) Appl. No.: 16/076,997

(22) PCT Filed: Jan. 24, 2017

(86) PCT No.: PCT/JP2017/002208
§ 371 (c)(1),
(2) Date: Aug. 9, 2018

(87) PCT Pub. No.: WO2017/138346
PCT Pub. Date: Aug. 17, 2017

(65) Prior Publication Data
US 2019/0052154 A1 Feb. 14, 2019

(30) Foreign Application Priority Data

Feb. 12, 2016 (JP) .................................. 2016-24484

(51) Int. Cl.
*H02K 11/33* (2016.01)
*H01L 25/18* (2006.01)
(Continued)

(52) U.S. Cl.
CPC ........... *H02K 11/33* (2016.01); *B62D 5/0406* (2013.01); *B62D 5/0463* (2013.01);
(Continued)

(58) Field of Classification Search
CPC ...... H02K 5/225; H02K 11/02; H02K 11/215; H02K 11/24; H02K 11/33; H02K 11/40;
(Continued)

(56) References Cited

U.S. PATENT DOCUMENTS

2012/0098361 A1* 4/2012 Yamasaki et al. ....... H02K 9/00
2012/0286602 A1 11/2012 Uchida et al.
(Continued)

FOREIGN PATENT DOCUMENTS

JP 2012-244638 A 12/2012
JP 2015-106973 A 6/2015

*Primary Examiner* — Tulsidas C Patel
*Assistant Examiner* — Rashad H Johnson
(74) *Attorney, Agent, or Firm* — Maschoff Brennan

(57) ABSTRACT

In an electronic control unit, a current circuit part is provided on a substrate and includes a switching element. During the control of a control target, a current having a relatively large value of a predetermined value or more flows in the current circuit part. A control circuit part is provided on the substrate and includes a control part that controls actuation of the switching element on the basis of a control signal to control the control target. A current input part is provided on the substrate so as to be located opposite to the control circuit with respect to the current circuit portion. To the current input portion, the current to be supplied to the control target via the current circuit portion is input.

17 Claims, 5 Drawing Sheets

(51) Int. Cl.
- *B62D 5/04* (2006.01)
- *H01L 25/07* (2006.01)
- *H02P 29/00* (2016.01)
- *H05K 7/14* (2006.01)
- *H02K 11/24* (2016.01)
- *H02P 6/00* (2016.01)
- *H02K 11/215* (2016.01)
- *H02K 11/40* (2016.01)
- *H01L 23/367* (2006.01)
- *H02K 5/22* (2006.01)
- *H02K 11/02* (2016.01)
- *H05K 7/20* (2006.01)

(52) U.S. Cl.
CPC .......... *H01L 23/3675* (2013.01); *H01L 25/07* (2013.01); *H01L 25/18* (2013.01); *H02K 5/225* (2013.01); *H02K 11/02* (2013.01); *H02K 11/215* (2016.01); *H02K 11/24* (2016.01); *H02K 11/40* (2016.01); *H02P 6/00* (2013.01); *H02P 29/00* (2013.01); *H05K 7/1432* (2013.01); *H05K 7/20854* (2013.01); *H02K 2211/03* (2013.01)

(58) Field of Classification Search
CPC . H02K 2211/03; H01L 23/3675; H01L 25/07; H01L 25/18; H02P 6/00; H02P 29/00; H05K 7/1432; H05K 7/20854; B62D 5/0406; B62D 5/0463
USPC .................................................. 310/71, 68 B
See application file for complete search history.

(56) References Cited

U.S. PATENT DOCUMENTS

| | | | |
|---|---|---|---|
| 2015/0156927 A1 | 6/2015 | Tsuboi | |
| 2016/0036288 A1* | 3/2016 | Yamasaki et al. | ....... H02K 9/00 |
| 2016/0181885 A1* | 6/2016 | Yamasaki et al. | ....... H02K 9/00 |
| 2016/0202087 A1* | 7/2016 | Kadoike | .............. G01B 21/045 |
| | | | 324/207.12 |
| 2017/0291640 A1* | 10/2017 | Fujita | ..................... B62D 5/049 |
| 2017/0349206 A1* | 12/2017 | Asao | ........................ H05K 7/20 |

* cited by examiner

ELECTRONIC CONTROL UNIT, AND ELECTRIC POWER STEERING DEVICE USING THE SAME

CROSS REFERENCE TO RELATED APPLICATION

This application is based on Japanese Patent Application No. 2016-24484 filed on Feb. 12, 2016, the disclosure of which is incorporated herein by reference.

TECHNICAL FIELD

The present disclosure relates to an electronic control unit which controls a control target, and an electric power steering device using the same.

BACKGROUND ART

There has conventionally been known an electronic control unit in which a current circuit part including a switching element, a control circuit part which controls actuation of the switching element to control a control target, and a current input part to which a current flowing in the control target is input via the current circuit part are provided on one substrate. For example, the electronic control unit described in Patent Literature 1 is used to control a motor of an electric power steering device. During the control of the motor, a large current flows in the current input part and in the current circuit part.

PRIOR ART LITERATURE

Patent Literature

Patent Literature 1: JP2012-244638A

SUMMARY OF INVENTION

In the electronic control unit in Patent Literature 1, no consideration has been given to the layout of the current circuit part, the control circuit part, and the current input part over the substrate. The components of the control circuit part are disposed along the direction in which the current input part and the current circuit part are arranged, i.e., direction in which the large current flows. This allows noise or potential fluctuations resulting from electrical fluctuations of the large current to affect the control circuit part, resulting in increased differences between influences on the individual components of the control circuit part and increased fluctuations between the individual components. As a result, product performance, noise performance, or robustness against disturbance may be degraded and, consequently, the control target may not be able to be controlled with high accuracy.

In addition, when the control circuit part and the current circuit part are disposed in spaced-apart relation or a slit or the like is formed between the control circuit part and the current circuit part so as to restrict the control circuit part from being affected by noise, the size of the substrate may be increased or the design of the substrate may be complicated.

An object of the present disclosure is to provide a small-sized electronic control unit capable of controlling a control target with high accuracy and an electric power steering device using the same.

According to an embodiment of the present disclosure, an electronic control unit, which controls a control target, includes a substrate, a current circuit part, a control circuit part, and a current input part.

The current circuit part is provided on the substrate and includes a switching element. During the control of the control target, a current flows in the current circuit part. Note that the switching element generates heat when actuated.

The control circuit part is provided on the substrate and includes a control part configured to control the control target by controlling actuation of the switching element on the basis of a control signal.

The current input part is provided on the substrate so as to be located opposite to the control circuit part with respect to the current circuit part. To the current input part, a current to be supplied to the control target via the current circuit part is input.

In the above-described configuration, the current circuit part, the control circuit part, and the current input part are provided on the substrate in order of the current input part, the current circuit part, and the control circuit part. In other words, the control circuit part is not disposed to extend along the direction in which the current input part and the current circuit part are arranged, i.e., direction in which a large current flows. Accordingly, noise or potential fluctuations resulting from electrical fluctuations of the large current do not affect the control circuit part, resulting in reduced differences between influences on the individual components of the control circuit part and reduced fluctuations between the individual components. This can improve product performance, noise performance, or robustness against disturbance and thus control the control target with high accuracy.

In addition, there is no need to dispose the control circuit part and the current circuit part in spaced-apart relation or form a slit or the like between the control circuit part and the current circuit part so as to restrict the control circuit part from being affected by noise. This can reduce the size of the substrate and simplify the design of the substrate. Therefore, it is possible to provide the small-sized electronic control unit.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
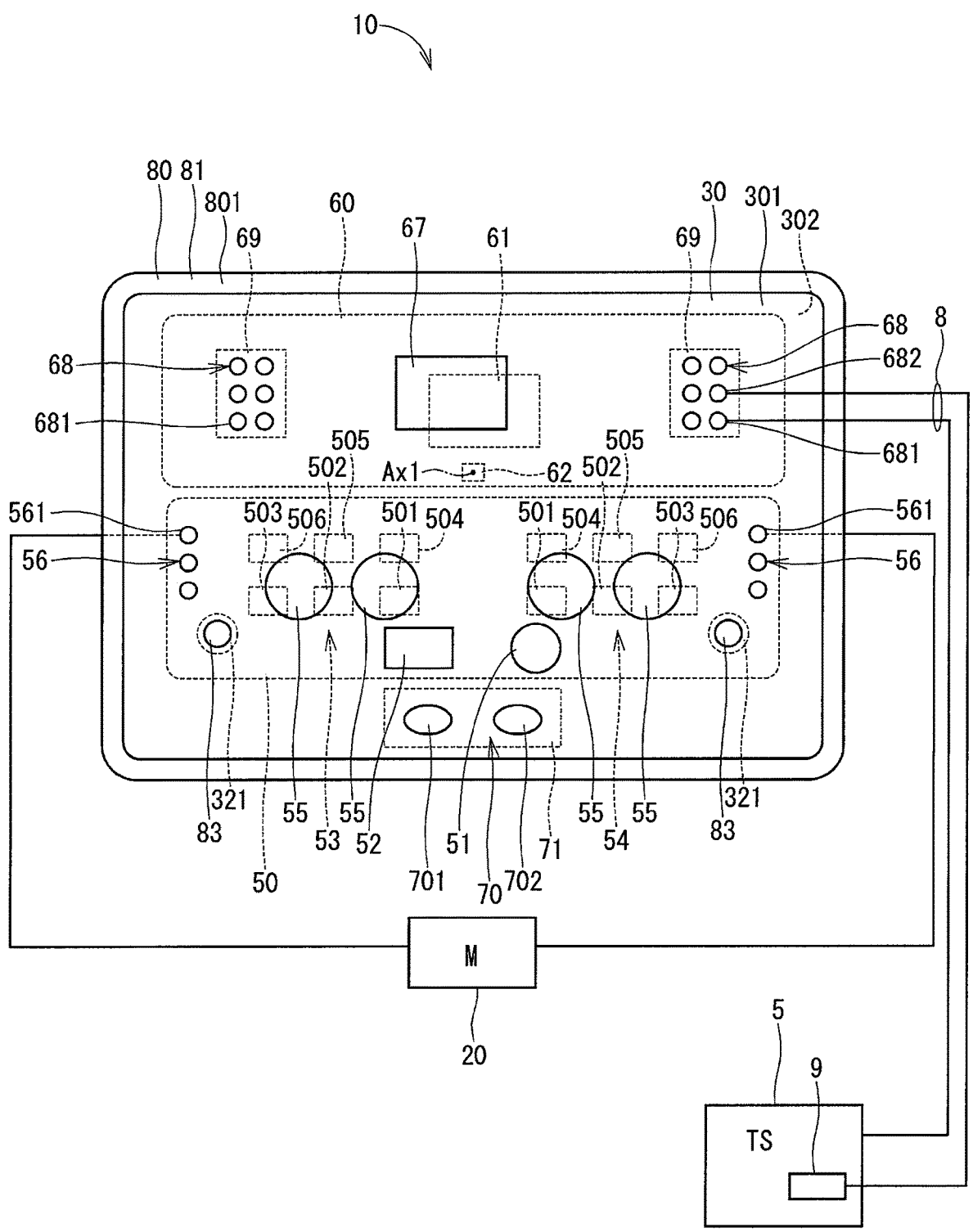
FIG. 1 is a plan view showing an electronic control unit according to a first embodiment of the present disclosure.

The following will describe electronic control units and electric power steering devices according to a plurality of embodiments of the present disclosure on the basis of the drawings. Note that substantially the same component parts in the plurality of embodiments are given the same reference numerals and a description thereof is omitted.

First Embodiment

Figure 3:
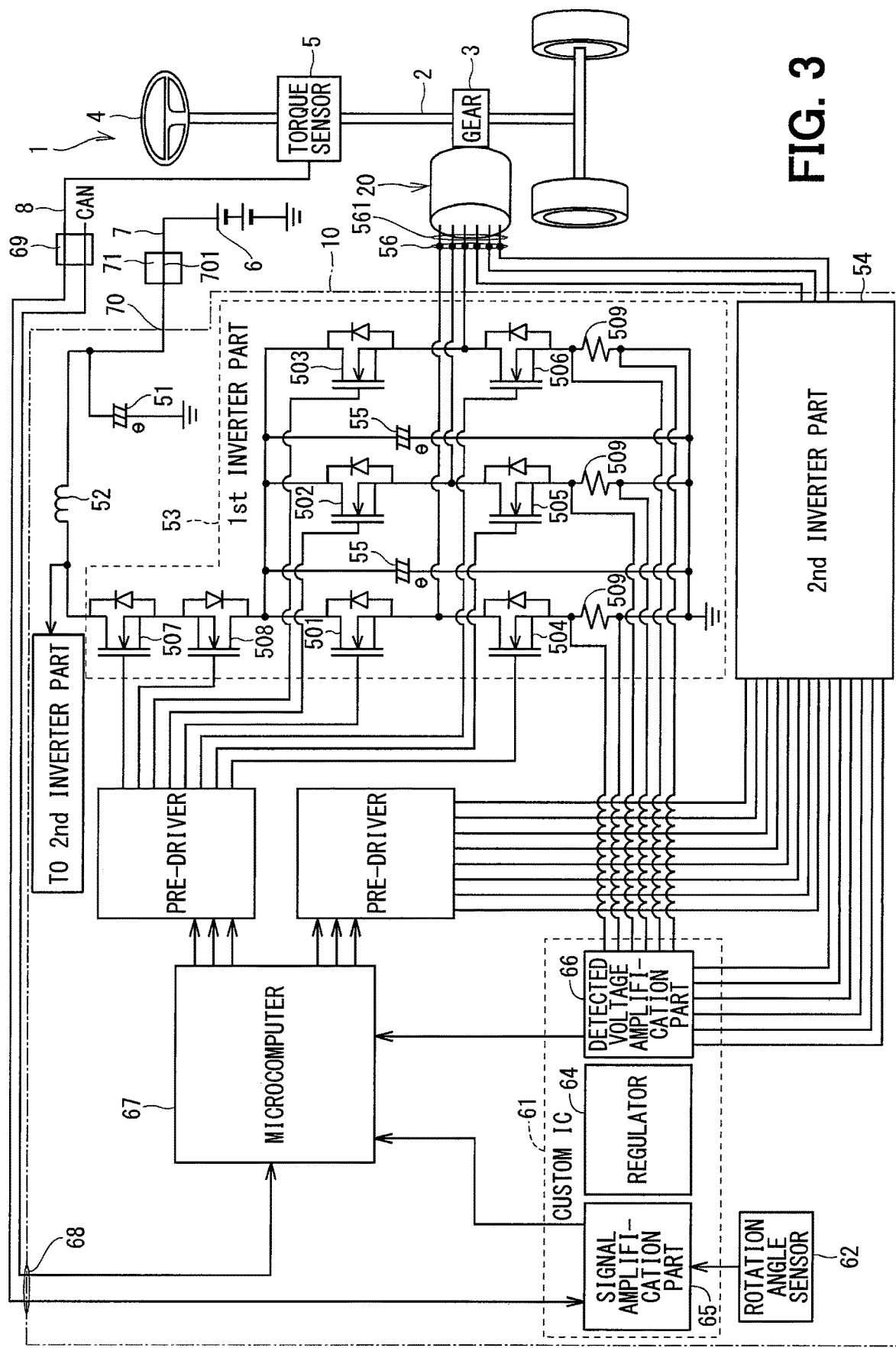
FIG. 3 is a view showing a circuit configuration and an application example of the electronic control unit according to the first embodiment of the present disclosure.

FIG. 1 shows an electronic control unit according to the first embodiment of the present disclosure. An electronic control unit 10 controls a motor (M) 20 as a control target. As shown in FIG. 3, the motor 20 is used as the drive unit of an electric power steering device 1 mounted in a vehicle. The motor 20 is mounted such that an end portion (output end 26) of a shaft 25 described later meshes with a gear 3 in a gear box provided around a column shaft 2. The motor 20 forwardly and backwardly rotates on the basis of a torque signal output from a torque sensor (TS) 5 which detects the steering torque of a steering 4, a vehicle speed signal acquired from a CAN (Controller Area Network) not shown, or the like and generates an assist torque related to steering. Thus, in the present embodiment, the electric power steering device 1 is a column-assist-type electric power steering device.

Figure 2A:
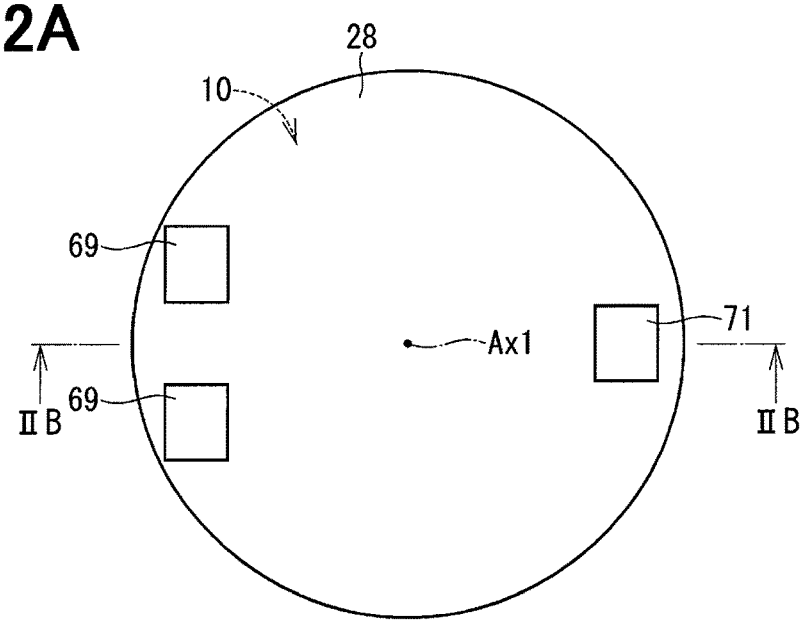
FIG. 2A is a top view of the electronic control unit according to the first embodiment of the present disclosure and a control target.
Figure 2B:
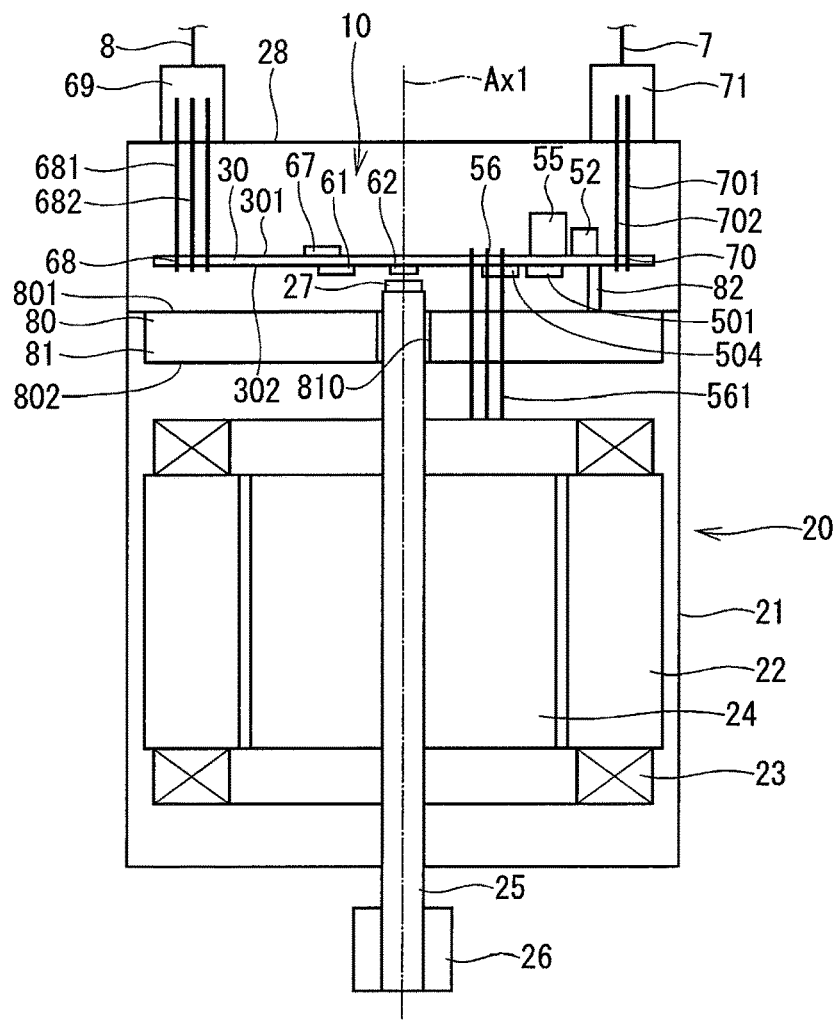
FIG. 2B is a cross-sectional view along the line IIB-IIB in FIG. 2A.

As shown in FIG. 2B, the motor 20 includes a motor case 21, a stator 22, winding wires 23, a rotor 24, the shaft 25, the output end 26, a magnet 27, and the like.

The motor case 21 is formed of a metal such as, e.g., aluminum into a bottomed cylindrical shape.

The stator 22 is formed of, e.g., a multi-layer steel plate or the like into a generally annular shape. The stator 22 is provided in the motor case 21 so as to be fixed.

The winding wires 23 are made of a metal such as, e.g., copper into linear shapes and wound around the stator 22. In the present embodiment, the wiring wires 23 are provided so as to correspond to three phases (U-phase, V-phase, and W-phase).

Similarly to the stator 22, the rotor 24 is formed of, e.g., a multi-layer steel plate, but into a generally cylindrical shape. The rotor 24 is provided in the stator 22 to be rotatable. On the outer wall of the rotor 24, a plurality of magnets are provided such that N-poles and S-poles alternate to be spaced apart at predetermined intervals in a circumferential direction (not shown).

The shaft 25 is made of, e.g., a metal into a rod shape. The shaft 25 is provided at the rotation center of the rotor 24. The output end 26 is provided at one of the end portions of the shaft 25. The output end 26 can mesh with the gear 3 in the electric power steering device 1.

The magnet 27 is provided at the other end of the shaft 25. The magnet 27 generates a magnetic flux. The shaft 25 is supported by the motor case 21 to be rotatable. This allows the rotor 24 to rotate in and relative to the stator 22.

As shown in FIG. 1, the torque sensor 5 has a GND terminal 9. The GND terminal 9 is connected to the lower-potential side of a battery 6 as a power source.

As shown in FIGS. 2A and 2B, the electronic control unit 10 is provided integrally with the motor 20 to be located opposite to the output end 26 of the motor 20. As shown in FIGS. 1 to 4, the electronic control unit 10 includes a substrate 30, a current circuit part 50, a control circuit part 60, a current input part 70, a heat sink 80 as a heat dissipator, a cover 28, heat conduction members 84 and 85, and the like.

The current circuit part 50 has a first capacitor 51, a coil 52, a first inverter part 53, a second inverter part 54, control target connection parts 56, and the like.

The control circuit part 60 has a custom IC 61, a rotation angle sensor 62, a microcomputer 67, a control signal input part 68, and the like.

The current input part 70 has a PIG terminal 701, a GND terminal 702, and the like.

As shown in FIG. 3, to the electronic control unit 10, an electric power is supplied from the battery 6 as the power source. The first capacitor 51 and the coil 52 form a filter circuit to reduce noise transmitted from another device sharing the battery 6 to the motor 20 and also reduce noise transmitted from the motor 20 to the other device sharing the battery 6. That is, the first capacitor 51 and the coil 52 reduce noise propagated to the outside. The coil 52 is connected in series between the battery 6 and each of the first inverter part 53 and the second inverter part 54 to attenuate power source fluctuations.

Each of the first inverter part 53 and the second inverter part 54 has switching elements 501 to 506, power source relays 507 and 508, second capacitors 55, shunt resistors 509, and the like.

In the present embodiment, each of the switching elements 501 to 506 is, e.g., a MOSFET (metal-oxide-semiconductor field-effect transistor) as a type of field effect transistor. Each of the switching elements 501 to 506 is controlled by a gate voltage so as to turn on and off between the source and the drain.

The upper-arm switching elements 501 to 503 have respective drains connected to the battery 6 and respective sources connected to the respective drains of the corresponding lower-arm switching elements 504 to 506. The lower-arm switching elements 504 to 506 have respective sources connected to the lower-potential side of the battery 6, i.e., to the ground. The connecting parts between the upper-arm switching elements 501 to 503 and the corresponding lower-arm switching elements 504 to 506 are electrically connected to the motor 20.

Similarly to the switching elements 501 to 506, the power source relays 507 and 508 are formed of MOSFETs. The power source relays 507 and 508 are provided between the switching elements 501 to 506 and the coil 52 and can cut off the current flowing to the motor 20 via the switching elements 501 to 506 in an abnormal situation.

The shunt resistors 509 are electrically connected between the switching elements 504 to 506 and the ground. By detecting the voltage or current applied to the shunt resistors 509, it is possible to detect the current flowing in the motor 20.

The second capacitors 55 are connected between wires to the upper-arm switching elements 501 to 503 which are closer to the battery 6 and the ground. That is, the second capacitors 55 are connected in parallel with the switching elements 501 to 506. The second capacitors 55 store charges to assist power supply to the switching elements 501 to 506 and absorb a ripple current caused by switching a current.

The custom IC 61 is a semiconductor integrated circuit including a regulator 64, a signal amplification part 65, a detected voltage amplification part 66, and the like.

The regulator 64 is a stabilization circuit which stabilizes the power from the battery 6. The regulator 64 stabilizes the power supplied to each of the parts. For example, the microcomputer 67 described later operates at a predetermined stable voltage (e.g., 5 V) using the regulator 64.

To the signal amplification part 65, signals from the rotation angle sensor 62, the torque sensor 5, and the like are input. The rotation angle sensor 62 is a magnetic flux detection element such as, e.g., a Hall IC. On the substrate 30 described later, the rotation angle sensor 62 is provided in the vicinity of the end portion of the shaft 25 of the motor 20 which is adjacent to the magnet 27, more specifically, on an axial line Ax1 of the shaft 25 (see FIG. 2B). The rotation angle sensor 62 detects a change in the magnetic flux generated from the magnet 27, i.e., an ambient magnetic flux (magnetic field) and transmits the resulting detection value as a signal related to the rotation angle of the rotor 24 (motor 20) to the signal amplification part 65. The signal amplification part 65 amplifies the signal related to the rotation angle of the motor 20 transmitted from the rotation angle sensor 62 and outputs the amplified signal to the microcomputer 67 described later.

The detected voltage amplification part 66 detects a voltage between the both ends of each of the shunt resistors 509, amplifies the resulting detection value, and outputs the amplified detection value to the microcomputer 67 described later.

The microcomputer 67 is a small-sized computer having a CPU as an arithmetic means, a ROM and a RAM as a storage means, and the like. In the microcomputer 67, the CPU executes various processing in accordance with the various programs stored in the ROM.

To the microcomputer 67, the signal related to the rotation angle of the motor 20 from the signal amplification part 65, the voltage between the both ends of each of the shunt resistors 509 from the detected voltage amplification part 66, the steering torque signal from the torque sensor 5, vehicle speed information from the CAN, and the like are input. When such signals are input to the microcomputer 67, the microcomputer 67 controls the first inverter part 53 via a pre-driver on the basis of the rotation angle of the motor 20. More specifically, the microcomputer 67 changes gate voltages in the switching elements 501 to 506 using the pre-driver and switches the switching elements 501 to 506 between the ON/OFF states to control the first inverter part 53.

The microcomputer 67 also controls the first inverter part 53 on the basis of the voltage between the both ends of each of the shunt resistors 509 which is input from the detected voltage amplification part 66 so as to bring the current supplied to the motor 20 (winding wires 23) closer to a sinusoidal wave. Note that, in the same manner as used to control the first inverter part 53 using the pre-driver, the microcomputer 67 controls the second inverter part 54 using the pre-driver.

The microcomputer 67 generates the pulse signal produced by PWM control via the pre-driver so as to assist the steering of the steering 4 in accordance with the vehicle speed on the basis of the vehicle speed information and the like from the rotation angle sensor 62, the torque sensor 5, the shunt resistors 509, and the CAN. The pulse signal is output to a 2-system inverter circuit including the first inverter part 53 and the second inverter part 54 to control the operation of switching each of the switching elements 501 to 506 in the first inverter part 53 and the second inverter part 54 between the ON/OFF states. As a result, in the individual phases of the winding wires 23 of the motor 20, sinusoidal wave currents in different phases flow to generate a rotating magnetic field. Under the rotating magnetic field, the rotor 24 and the shaft 25 integrally rotate. As a result of the rotation of the shaft 25, a drive force is output from the output end 26 to the gear 3 around the column shaft 2 to assist steering of the steering 4 by the driver.

Thus, in the present embodiment, the electronic control unit 10 has the two-system inverter parts (53 and 54) to control power conduction to the winding wires 23. Each of the systems includes the U-phase, the V-phase, and the W-phase. In addition, each of the first inverter part 53 and the second inverter part 54 (switching elements 501 to 506) generates heat when actuated (switched).

The first capacitor 51 and the coil 52 each described above correspond to a noise reduction element. The microcomputer 67 and the custom IC 61 correspond to a control part. The signal from the torque sensor 5, the vehicle speed information from the CAN, and the like correspond to a control signal.

The heat sink 80 is made of a metal such as, e.g., aluminum. The heat sink 80 has a main body 81 and bosses 82. The main body 81 is formed in a plate shape. The plurality of bosses 82 are formed so as to protrude in the form of columns from one surface 801 of the main body 81. As shown in FIG. 2B, the main body 81 is fixed to the motor case 21 in such a manner as to close a portion of the opening of the motor case 21. The main body 81 has a hole portion 810 extending through the main body 81 in a thickness direction. In the hole portion 810, the end portion of the shaft 25 which is adjacent to the magnet 27 is inserted. In the present embodiment, the heat sink 80 is connected to the lower-potential side of the battery 6.

The substrate 30 is a printed substrate made of a glass fiber and an epoxy resin, such as, e.g., FR-4. The substrate 30 has a first surface 301 as one surface and a second surface 302 as another surface. The substrate 30 is provided opposite to the rotor 24 with respect to the main body 81 of the heat sink 80 so as to be generally parallel with the main body 81. In the present embodiment, the substrate 30 is screwed into the bosses 82 of the heat sink 80 with screws 83 (see FIG. 4). Accordingly, the end portions of the bosses 82 opposite to the main body 81 are in contact with the second surface 302 of the substrate 30. As a result, between the substrate 30 and the main body 81 of the heat sink 80, a gap equivalent to the height of each of the bosses 82 is formed.

The cover 28 is formed in a dish shape and attached to the motor case 21 so as to cover the substrate 30 and close the opening of the motor case 21.

As shown in FIG. 1, the current circuit part 50, the control circuit part 60, and the current input part 70 are provided on the substrate 30. The current input part 70 is provided herein on the substrate 30 so as to be located opposite to the control circuit part 60 with respect to the current circuit part 50. That is, the current input part 70, the current circuit part 50, and the control circuit part 60 are provided on the substrate 30 so as to be arranged in this order.

In the present embodiment, the current circuit part 50 is provided on the substrate 30 on a one-to-one basis. The one current circuit part 50 includes the two-system inverter parts (53 and 54). Note that each of the first capacitor 51, the coil 52, and the current input part 70 is provided for the current circuit part 50 on a one-to-one basis.

Each of the PIG terminal 701 and the GND terminal 702 in the current input part 70 is formed of a metal such as, e.g., copper into a rod shape. Each of the PIG terminal 701 and the GND terminal 702 is provided to have one end connected to the substrate 30 and the other end exposed to the outside of the cover 28 (see FIG. 2B). Around the other ends of the PIG terminal 701 and the GND terminal 702, a power source connector 71 is formed on the cover 28. To the power source connector 71, a harness 7 connected to the battery 6 is connected. As a result, the PIG terminal 701 is connected to the higher-potential side of the battery 6, while the GND terminal 702 is connected to the lower-potential side of the battery 6.

The control signal input part 68 of the control circuit part 60 has a control terminal 681 and a reference potential terminal 682. Each of the control terminal 681 and the reference potential terminal 682 is formed of a metal such as, e.g., copper. Each of the control terminal 681 and the reference potential terminal 682 is provided to have one end connected to the substrate 30 and the other end exposed to the outside of the cover 28 (see FIG. 2B). Around the other ends of the control terminal 681 and the reference potential terminal 682, a control connector 69 is formed on the cover 28. To the control connector 69, a harness 8 connected to the torque sensor 5, a signal line from the CAN, and the like are connected. As a result, to the control terminal 681 of the control signal input part 68 of the control circuit part 60, a signal from the torque sensor 5 as one of the control signals transmitted to the microcomputer 67 is input via the harness 8.

In the present embodiment, the reference potential terminal 682 is connected to the GND terminal 9 of the torque sensor 5 via the harness 8. Accordingly, the reference potential terminal 682 and the GND terminal 9 are at the same potential. Thus, the reference potential terminal 682 determines a reference potential for the torque sensor 5 as an external sensor.

The control target connection parts 56 in the current circuit part 50 have motor terminals 561. The motor terminals 561 are formed of a metal such as, e.g., copper into rod shapes. Each of the motor terminals 561 is provided to have one end connected to the winding wire 23 and the other end connected to the substrate 30 (see FIG. 2B). The other end of the motor terminal 561 is electrically connected to the PIG terminal 701 via the first inverter part 53 and the second inverter part 54. That is, the motor terminals 561 electrically connect the motor 20 and the current input part 70.

Figure 4:
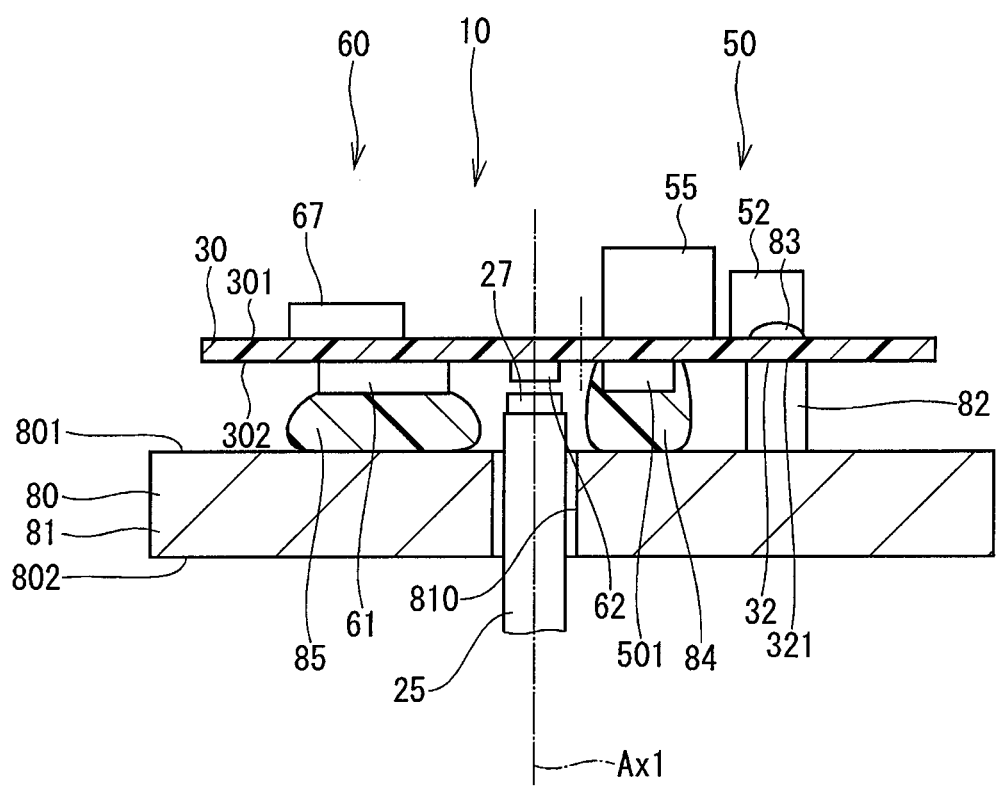
FIG. 4 is a cross-sectional view showing a heat dissipator in the electronic control unit according to the first embodiment of the present disclosure and the vicinity thereof.

As shown in FIGS. 1 and 4, the first capacitor 51, the coil 52, the second capacitor 55, and the microcomputer 67 are mounted on the first surface 301 of the substrate 30. The switching elements 501 to 506, the custom IC 61, and the rotation angle sensor 62 are mounted on the second surface 302 of the substrate 30.

Note that the rotation angle sensor 62, which is included in the control circuit part 60, is provided at a position where the rotation angle sensor 62 does not overlap respective portions of the switching elements 501 to 506 in the thickness direction of the substrate 30.

The microcomputer 67 is provided at a position where a portion thereof overlaps a portion of the custom IC 61 in the thickness direction of the substrate 30.

As shown in FIG. 4, the substrate 30 has a surface wire 32 in the surface of the substrate 30 which is adjacent to the heat sink 80, i.e., the second surface 302. The surface wire 302 is made of a metal such as, e.g., copper. The heat conduction members 84 and 85 are provided between the substrate 30 and the main body 81 of the heat sink 80. Each of the heat conduction members 84 and 85 is a gel-like insulating member obtained by mixing, e.g., a silicone resin with a filler such as aluminum oxide. The heat conduction member 84 is provided so as to be in contact with the one surface 801 of the main body 81, the respective surfaces of the switching elements 501 to 506 which are adjacent to the heat sink 80, the respective side surfaces of the switching elements 501 to 506, and the second surface 302 of the substrate 30. The heat conduction member 85 is provided so as to be in contact with the one surface 801 of the main body 81 and the surface of the custom IC 61 which is adjacent to the heat sink 80. Accordingly, the heat generated upon actuation of the switching elements 501 to 506 and the custom IC 61 conducts to the heat sink 80 via the heat conduction members 84 and 85. This allows the heat sink 80 to efficiently dissipate the heat generated upon actuation of the switching elements 501 to 506 and the custom IC 61.

As shown in FIG. 4, the first capacitor 51 and the coil 52 which serve as the noise reduction element are provided on the first surface 301 of the substrate 30. The respective heights of the first capacitor 51 and the coil 52 from the substrate 30 are different and larger than the respective heights of the switching elements 501 to 506, the custom IC 61, and the rotation angle sensor 62 from the substrate 30. In the present embodiment, the switching elements 501 to 506, the custom IC 61, and the rotation angle sensor 62 which have smaller heights are provided on the second surface 302 of the substrate 30, i.e., adjacent to the main body 81 of the heat sink 80, while the first capacitor 51 and the coil 52 which have larger heights are provided on the first surface 301 of the substrate 30. This can reduce the distance between the substrate 30 and the main body 81 and allow the one surface 801 of the main body 81 to be formed into a planar shape.

As shown in FIG. 1, the first inverter part 53 and the second inverter part 54 are provided on the substrate 30 so as to be located opposite to the current input part 70 with respect to the first capacitor 51 and the coil 52 which serve as the noise reduction element.

As shown in FIG. 4, the surface wire 32 has connection points 321 electrically connected to the bosses 82 of the heat sink 80.

As shown in FIG. 1, the two connection points 321 are provided for the one current circuit part 50. In addition, the control target connection parts 56 are provided on the substrate 30 so as to be located opposite to the current input part 70 with respect to the connection points 321.

(1) As described above, in the present embodiment, the electronic control unit 10 which controls the motor 20 includes the substrate 30, the current circuit part 50, the control circuit part 60, and the current input part 70.

The current circuit part 50 is provided on the substrate 30 and includes the switching elements 501 to 506. When the motor 20 is controlled, a current having a relatively large value, which is a predetermined value or more, flows in the current circuit part 50. Note that the switching elements 501 to 506 generate heat when actuated.

The control circuit part 60 is provided on the substrate 30 and includes the microcomputer 67 and the custom IC 61 which can control the motor 20 by controlling actuation of the switching elements 501 to 506 on the basis of the control signal.

The current input part 70 is provided on the substrate 30 so as to be located opposite to the control circuit part 60 with respect to the current circuit part 50. To the current input part 70, the current that is to be supplied to the motor 20 via the current circuit part 50 is input.

Thus, in the present embodiment, the current circuit part 50, the control circuit part 60, and the current input part 70 are provided on the substrate 30 in order of the current input part 70, the current circuit part 50, and the control circuit part 60. That is, the control circuit part 60 is not disposed so as to extend along the direction in which the current input part 70 and the current circuit part 50 are arranged, i.e., direction in which a large current flows. Accordingly, noise or potential fluctuations resulting from electrical fluctuations of the large current do not affect the control circuit part 60, and influence on the individual components of the control circuit part 60, such as the microcomputer 67 and the custom IC 61, is reduced to reduce the fluctuations between the individual components. This can improve product performance, noise performance, and robustness against disturbance. As a result, it is possible to control the motor 20 with high accuracy.

Also, in the present embodiment, there is no need to dispose the control circuit part 60 and the current circuit part 50 in spaced-apart relation or form a slit or the like between the control circuit part 60 and the current circuit part 50 so as to restrict the control circuit part 60 from being affected by noise. This can reduce the size of the substrate and simplify the design of the substrate. Therefore, it is possible to provide the small-sized electronic control unit 10.

(2) The control circuit part 60 includes the control signal input part 68 to which the control signal to be transmitted to the microcomputer 67 and the custom IC 61 is input. In this case, it is possible to inhibit noise resulting from the current flowing in the current input part 70 and the current circuit part 50 from affecting the control signal. This allows the motor 20 to be controlled with higher accuracy.

(3) The control signal input part 68 has the reference potential terminal 682 connected to the GND terminal 9 of the torque sensor 5. In this case, the reference potential terminal 682 and the GND terminal 9 are at the same potential. As a result, even when the reference potential for the control circuit part 60 fluctuates, the torque sensor 5 electrically oscillates similarly to the control circuit part 60. Accordingly, it is possible to reduce the influence received by the control signal output from the torque sensor 5 from fluctuations in reference potential. This allows the motor 20 to be controlled with higher accuracy.

(4) The electronic control unit 10 further includes the heat sink 80 configured to dissipate the heat generated upon actuation of the switching elements 501 to 506. The substrate 30 has the surface wire 32 in the surface 302 adjacent to the heat sink 80. The surface wire 32 has the connection points 321 electrically connected to the heat sink 80. Accordingly, it is possible to connect the surface wire 32 to the lower-potential side of the battery 6 via the heat sink 80. In addition, it is also possible to dissipate the heat generated upon actuation of the custom IC 61 or the like via the surface wire 32, the connection points 321, and the bosses 82.

For the one current circuit part 50, the two connection points 321 are provided. This can improve noise performance and a heat dissipation property.

(5) The current circuit part 50 further includes the control target connection parts 56 which electrically connect the motor 20 and the current input part 70. As a result, during the control of the motor 20, a large current flows in each of the control target connection parts 56, but it is possible to inhibit fluctuations in the current flowing in the control target connection part 56 from affecting the control circuit part 60.

The control target connection parts 56 are provided on the substrate 30 so as to be located opposite to the current input part 70 with respect to the connection points 321. Accordingly, it is possible to inhibit the noise generated in the electronic control unit 10 from being released to the outside.

(6) The heat sink 80 has the main body 81 provided at a position spaced apart a predetermined distance from the substrate 30 and the bosses 82 extending from the main body 81 toward the substrate 30 to come in contact with the substrate 30. Accordingly, it is possible to maintain the distance between the substrate 30 and the main body 81 at the height of each of the bosses 82 from the main body 81. That is, it is possible to control the gap between the substrate 30 and the main body 81 using the bosses 82. Note that the bosses 82 are electrically connected to the surface wire 32 in the substrate 30.

(7) The control circuit part 60 has the microcomputer 67 which performs an arithmetic operation on the basis of a control signal and the custom IC 61 having the regulator 64 which stabilizes the current to be supplied to the microcomputer 67 and the signal amplification part 65 which amplifies the input control signal. The microcomputer 67 is provided on the first surface 301 of the substrate 30. The custom IC 61 is provided on the second surface 302 of the substrate 30 to have a portion overlapping a portion of the microcomputer 67 in the thickness direction of the substrate 30. That is, the custom IC 61 is provided in the vicinity of the microcomputer 67.

(8) The switching elements 501 to 506 are provided on the second surface 302 of the substrate 30. The electronic control unit 10 further includes the heat sink 80 provided on the second surface 302 of the substrate 30 and configured to dissipate the heat generated upon actuation of the switching elements 501 to 506 and the custom IC 61. Consequently, it is possible to suppress a temperature increase when the switching elements 501 to 506 and the custom IC 61 are actuated. This can allow the motor 20 to be controlled with high accuracy and reduce the size of the substrate 30.

(9) The current circuit part 50 further includes the coil 52 and the first capacitor 51 which are provided on the first surface 301 of the substrate 30 and configured to reduce the noise to be propagated to the outside. By providing elements at different heights from the substrate 30, such as the coil 52 and the first capacitor 51, on the first surface 301 of the substrate 30, i.e., surface opposite to the heat sink 80, the one surface 801 of the main body 81 of the heat sink 80 can be formed into a simple planar shape. This can simplify the shape of the heat sink 80 and achieve a quality improvement, a size reduction, and a cost reduction.

(10) The current circuit part 50 further includes the second capacitor 55 configured to absorb a ripple current generated upon actuation of the switching elements 501 to 506. The second capacitor 55 is provided on the substrate 30 so as to be located opposite to the current input part 70 with respect to the first capacitor 51 and the coil 52 which serve as the noise reduction element. Consequently, it is possible to inhibit the noise generated in the electronic control unit 10 from being released to the outside.

(11) The electronic control unit 10 further includes the heat conduction members 84 and 85 provided between the substrate 30 and the heat sink 80 and configured to conduct the heat generated upon actuation of the switching elements 501 to 506 and the custom IC 61 to the heat sink 80.

The heat conduction members 84 and 85 are provided in contact with the respective surfaces of the switching elements 501 to 506 and the custom IC 61, the respective surfaces being adjacent to the heat sink 80. This can promptly dissipate the heat generated upon actuation of the switching elements 501 to 506 and the custom IC 61.

(12) The heat conduction member 84 is provided in contact with the surfaces of the switching elements 501 to 506 other than the surfaces thereof adjacent to the heat sink 80. In this case, it is possible to more promptly dissipate the heat generated upon actuation of the switching elements 501 to 506. It is also possible to restrict the heat generated upon actuation of the switching elements 501 to 506 from being transmitted to the control circuit part 60.

(13) The motor 20 to be controlled has the stator 22, the rotor 24 provided to be rotatable relative to the stator 22, and the winding wires 23 provided around the stator 22.

The control circuit part 60 further includes the rotation angle sensor 62 configured to detect the rotation angle of the rotor 24. The rotation angle sensor 62, which is included in the control circuit part 60, is provided at a position where the rotation angle sensor 62 does not overlap respective portions of the switching elements 501 to 506 in the thickness direction of the substrate 30. This can restrict a magnetic flux formed by the current flowing in the current circuit part 50 from affecting the rotation angle sensor 62. Consequently, it is possible to control the motor 20 with high accuracy.

(17) The electric power steering device 1 includes the above-described electronic control unit 10 and the motor 20. The motor 20 is controlled by the electronic control unit 10 and configured to output an assist torque which assists steering by the driver. The electronic control unit 10 in the present embodiment has a reduced size and can control the motor 20 with high accuracy. Accordingly, the electronic control unit 10 in the present embodiment is appropriately used as an electronic control unit for an electric power steering device which is mounted in a limited space in a vehicle and required to be actuated with high accuracy.

Second Embodiment

Figure 5:
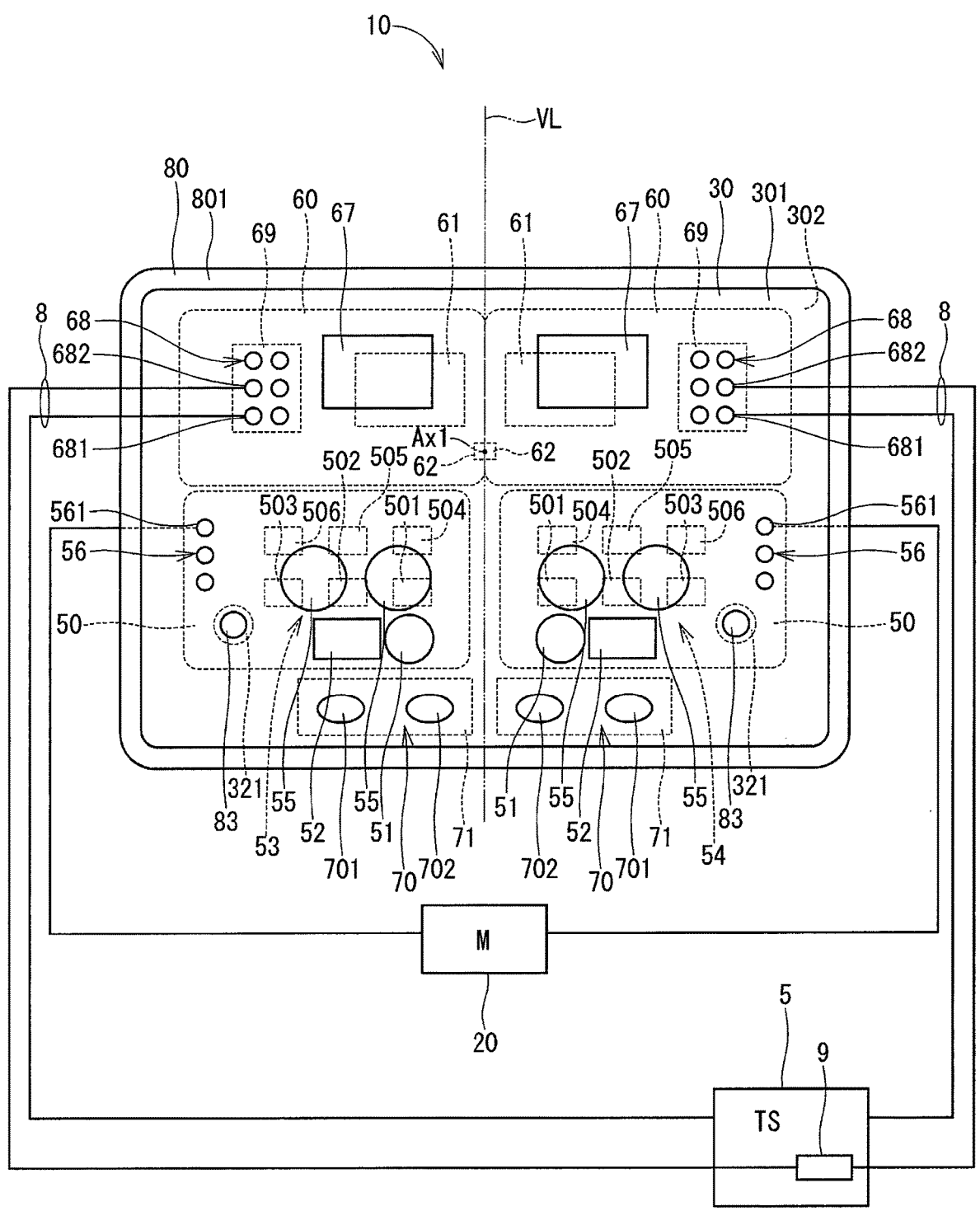
FIG. 5 is a plan view showing an electronic control unit according to a second embodiment of the present disclosure.

FIG. 5 shows an electronic control unit according to the second embodiment of the present disclosure.

In the second embodiment, the current circuit part 50, the control circuit part 60, and the current input part 70 are provided in pairs.

Of the two current circuit parts 50, one includes the first inverter part 53 and the other includes the second inverter part 54. Each of the two control circuit parts 60 includes the microcomputer 67, the custom IC 61, and the rotation angle sensor 62. Note that each of the two rotation angle sensors 62 is provided so as to be located on the axial line Ax1 of the shaft 25 or in the vicinity of the axial line Ax1. Also, for each of the first inverter part 53 and the second inverter part 54, the one first capacitor 51 and the one coil 52 are provided.

To correspond to the two current circuit parts 50, the two current input parts 70 are provided respectively.

As shown in FIG. 5, the two current circuit parts 50 and the two control circuit parts 60 are disposed on the substrate 30 so as to be line-symmetrical with respect to a virtual line VL orthogonal to the axial line Ax1 of the shaft 25 which serves as a symmetrical axis. The two current input parts 70 are also disposed so as to be line-symmetrical with respect to the virtual line VL serving as the symmetrical axis.

(14) As described above, in the present embodiment, the two current circuit parts 50 are provided for the one substrate 30. This can ensure redundancy with respect to the conversion of power to be supplied to the motor 20.

The two current circuit parts 50 are disposed on the substrate 30 so as to be line-symmetrical. This can reduce the influence of the noise caused by the currents flowing in the current circuit parts 50 on the control circuit parts 60.

(15) The two current input parts 70 are provided correspondingly to the two current circuit parts 50. In this case, it is possible to ensure redundancy with respect to power supply to the motor 20.

(16) The two control circuit parts 60 are provided for the one substrate 30. In this case, it is possible to ensure redundancy with respect to the control of the motor 20.

The two control circuit parts 60 are disposed on the substrate 30 so as to be line-symmetrical. This can further suppress the influence of the noise caused by the currents flowing in the current circuit parts 50 on the control circuit parts 60.

Other Embodiments

In another embodiment of the present disclosure, the control signal input part 68 may also be provided at a position away from the control circuit part 60.

In still another embodiment of the present disclosure, the control terminal 681 of the control signal input part 68 need not necessarily be connected to the GND terminal 9 of the torque sensor 5.

In yet another embodiment of the present disclosure, the custom IC 61 may also have either one of the regulator 64 and the signal amplification part 65.

In still another embodiment of the present disclosure, the custom IC 61 need not necessarily be disposed such that a portion thereof overlaps a portion of the microcomputer 67 in the thickness direction of the substrate 30.

In yet another embodiment of the present disclosure, the heat sink 80 need not necessarily be provided.

In still another embodiment of the present disclosure, the first capacitor 51 and the coil 52 which serve as the noise reduction element may also be provided on the second surface 302 of the substrate 30.

In yet another embodiment of the present disclosure, the first inverter part 53 need not necessarily be provided so as to be located opposite to the current input part 70 with respect to the first capacitor 51 and the coil 52. That is, the first inverter part 53, the second inverter part 54, the first capacitor 51, the coil 52, and the current input part 70 may be disposed in any layout over the substrate 30.

In still another embodiment of the present disclosure, at least one of the heat conduction members 84 and 85 need not necessarily be provided.

In yet another embodiment of the present disclosure, the heat sink 80 need not necessarily have the bosses 82. Also, the surface wire 32 need not necessarily have the connection points 321.

In still another embodiment of the present disclosure, the control target connection parts 56 need not necessarily be provided so as to be located opposite to the current input part 70 with respect to the connection points 321. That is, the control target connection parts 56, the connection points 321, and the current input part 70 may be disposed in any layout over the substrate 30.

In the second embodiment described above, the example in which the two rotation angle sensors 62 are provided for the one substrate 30 is shown. By contrast, in another embodiment of the present disclosure, it may also be possible that, for the substrate 30, the components of the control circuit part 60 other than the rotation angle sensor 62 are provided in pairs and the one rotation angle sensor 62 is provided. Also, in still another embodiment of the present disclosure, the control circuit part 60 need not necessarily include the rotation angle sensor 62.

In the second embodiment described above, an example in which the current circuit part 50, the control circuit part 60, and the current input part 70 are provided in pairs is shown. By contrast, in yet another embodiment of the present disclosure, it may also be possible to adopt a configuration in which at least one of the current circuit part 50, the control circuit part 60, and the current input part 70 is provided in a pair. In this case, the function of each of the parts can be made redundant.

In each of the embodiments described above, a so-called mechatronically integrated motor in which the electronic control unit 10 and the motor 20 are integrally provided is shown. By contrast, in another embodiment of the present disclosure, the electronic control unit 10 and the motor 20 may also be separately provided.

The electronic control unit according to the present disclosure may also be used to control the driving of electric equipment such as the motor of not only an electric power steering device, but also another device.

Thus, the present disclosure is not limited to the above-described embodiments, but can be implemented in various ways within the scope not departing from the gist thereof.

The invention claimed is:

1. An electronic control unit for controlling a control target, the electronic control unit comprising:
a substrate;
a current circuit part which is provided on the substrate and includes a switching element and in which a current flows during control of the control target;
a control circuit part which is provided on the substrate and includes a control part that is configured to control actuation of the switching element on the basis of a control signal to control the control target; and
a current input part which is provided on the substrate so as to be located opposite to the control circuit part with respect to the current circuit part and to which the current to be supplied to the control target via the current circuit part is input, wherein
the control circuit part further includes a control signal input part,
the control signal input part includes a control terminal and a reference potential terminal,
the control terminal is to be connected to an external sensor to receive the control signal to be transmitted to the control part,
the reference potential terminal is to be connected to a GND terminal of the external sensor, and
the reference potential terminal and the GND terminal are at a same potential.

2. The electronic control unit according to claim 1,
wherein the control part includes a microcomputer which performs an arithmetic operation on the basis of the control signal and a custom IC having at least one of a regulator which stabilizes a current to be supplied to the microcomputer and a signal amplification part which amplifies the control signal input to the signal amplification part,
wherein the microcomputer is provided on a first surface of the substrate, and
wherein the custom IC is provided on a second surface of the substrate such that at least a part of the custom IC overlaps at least a part of the microcomputer in a thickness direction of the substrate.

3. The electronic control unit according to claim 2,
wherein the switching element is provided adjacent to the second surface of the substrate,
the electronic control unit further comprising:
a heat dissipator which is provided on the second surface of the substrate and configured to dissipate heat generated upon actuation of the switching element and the custom IC.

4. The electronic control unit according to claim 3,
wherein the current circuit part further includes a noise reduction element which is provided on the first surface of the substrate and is configured to reduce noise propagated to an outside.

5. The electronic control unit according to claim 4,
wherein the noise reduction element includes a coil and a first capacitor, wherein the current circuit part further includes a second capacitor configured to absorb a ripple current generated upon actuation of the switching element, and
wherein the second capacitor is provided on the substrate so as to be located opposite to the current input part with respect to the noise reduction element.

6. The electronic control unit according to claim 3, further comprising:
a heat conduction member which is provided between the substrate and the heat dissipator and is configured to conduct the heat generated upon actuation of the switching element and the custom IC to the heat dissipator,
wherein the heat conduction member is provided in contact with respective surfaces of the switching element and the custom IC which are adjacent to the heat dissipator.

7. The electronic control unit according to claim 6,
wherein the heat conduction member is provided in contact with the substrate and a surface of the switching element which is other than the surface adjacent to the heat dissipator.

8. The electronic control unit according to claim 1,
wherein the control target is a motor having a stator, a rotor provided to be rotatable relative to the stator, and a winding wire provided around the stator, and
wherein the control circuit part further includes a rotation angle sensor configured to detect a rotation angle of the rotor.

9. The electronic control unit according to claim 1,
wherein the current circuit part is one of two current circuit parts provided for the one substrate, and
wherein the two current circuit parts are disposed on the substrate so as to be line-symmetrical.

10. The electronic control unit according to claim 9,
wherein the current input part is one of two current input parts provided correspondingly to the two current circuit parts.

11. The electronic control unit according to claim 1,
wherein the control circuit part is one of two control circuit parts provided for the one substrate, and
wherein the two control circuit parts are disposed on the substrate so as to be line-symmetrical.

12. An electric power steering device, comprising:
the electronic control unit according to claim 1; and
the control target which is controlled by the electronic control unit and is configured to output an assist torque which assists steering by a driver.

13. The electric power steering device according to claim 12, wherein
the external sensor is a torque sensor.

14. The electronic control unit according to claim 1, wherein
the external sensor is a torque sensor.

15. An electronic control unit for controlling a control target, the electronic control unit comprising:
a substrate;
a current circuit part which is provided on the substrate and includes a switching element and in which a current flows during control of the control target;
a control circuit part which is provided on the substrate and includes a control part that is configured to control actuation of the switching element on the basis of a control signal to control the control target;
a current input part which is provided on the substrate so as to be located opposite to the control circuit part with respect to the current circuit part and to which the current to be supplied to the control target via the current circuit part is input; and a heat dissipator configured to dissipate heat generated upon actuation of the switching element, wherein the substrate has a surface wire on a surface of the substrate which is adjacent to the heat dissipator, wherein the surface wire has a connection point electrically connected to the heat dissipator, and wherein the surface wire has one or more connection points for one current circuit part.

16. The electronic control unit according to claim 15, wherein the current circuit part further includes a control target connection part which electrically connects the control target and the current input part, and wherein the control target connection part is provided on the substrate so as to be located opposite to the current input part with respect to the connection point.

17. The electronic control unit according to claim 15, wherein the heat dissipator has a main body which is provided at a position spaced apart a predetermined distance from the substrate and a boss which extends from the main body toward the substrate and comes in contact with the substrate.

* * * * *